United States Patent [19]

Mack

[11] 4,243,974
[45] Jan. 6, 1981

[54] WIDE DYNAMIC RANGE ANALOG TO DIGITAL CONVERTER

[75] Inventor: Rodney L. Mack, Los Gatos, Calif.

[73] Assignee: E. I. Du Pont de Nemours and Company, Wilmington, Del.

[21] Appl. No.: 880,947

[22] Filed: Feb. 24, 1978

[51] Int. Cl.³ .................................. H03K 13/02
[52] U.S. Cl. ...................... 340/347 NT; 340/347 M; 364/832
[58] Field of Search .... 340/347 M, 347 NT, 347 AD, 340/347 CC; 364/605, 733, 832, 833

[56] References Cited

U.S. PATENT DOCUMENTS

| | | | |
|---|---|---|---|
| 3,359,410 | 12/1967 | Frisby et al. | 364/828 |
| 3,475,600 | 10/1969 | Spence | 364/571 |
| 3,493,964 | 2/1970 | Hunger | 340/347 AD |
| 3,628,003 | 12/1971 | Spence | 364/833 |
| 3,634,770 | 1/1972 | Spreitzhofer | 328/115 |
| 3,652,957 | 3/1972 | Goodman | 325/38 B X |
| 3,754,232 | 8/1973 | Gut et al. | 340/347 AD |
| 3,786,491 | 1/1974 | Carleton | 340/347 NT |
| 3,786,492 | 1/1974 | Carleton | 340/347 CC |
| 3,800,236 | 3/1974 | Riethmuller et al. | 328/162 |
| 3,824,481 | 7/1974 | Sponholz et al. | 328/162 |
| 3,824,588 | 7/1974 | Vermillion | 340/347 CC |
| 3,956,700 | 5/1976 | Condon | 325/38 B |
| 3,970,943 | 7/1976 | Chapman et al. | 328/151 |

OTHER PUBLICATIONS

Hoeschele, Analog-to-Digital/Digital-to-Analog Conversion Techniques, 1968, pp. 416-420.

Primary Examiner—Thomas J. Sloyan

[57] ABSTRACT

The conversion of an analog signal which varies over a wide dynamic range, to digital form is accomplished by integrating the analog signal and, simultaneously therewith, integrating in a sense opposite that of the analog signal a reference signal of sufficient amplitude, to maintain the stored charge within the integrator at a relatively low nominal value. This is accomplished by placing comparators on the output of the integrator which function to cause a counter to count up or down in accordance with the relative amplitudes of the analog and reference signals as is necessary to bring the stored charge in the integrator back to the low nominal value. The output of this counter is applied to a range decoder which applies selected geometrically varying ranges of digital signals to a digital to analog converter. The output of the digital to analog converter is applied both to the subtracting or negative input of the integrator, and also provides a reference signal for the comparator. By controlling the time period of each integration and counting the amount of stored energy removed from the integrator, the counter output which is related to the such removed stored energy, is the digital equivalent of the analog signal.

8 Claims, 4 Drawing Figures

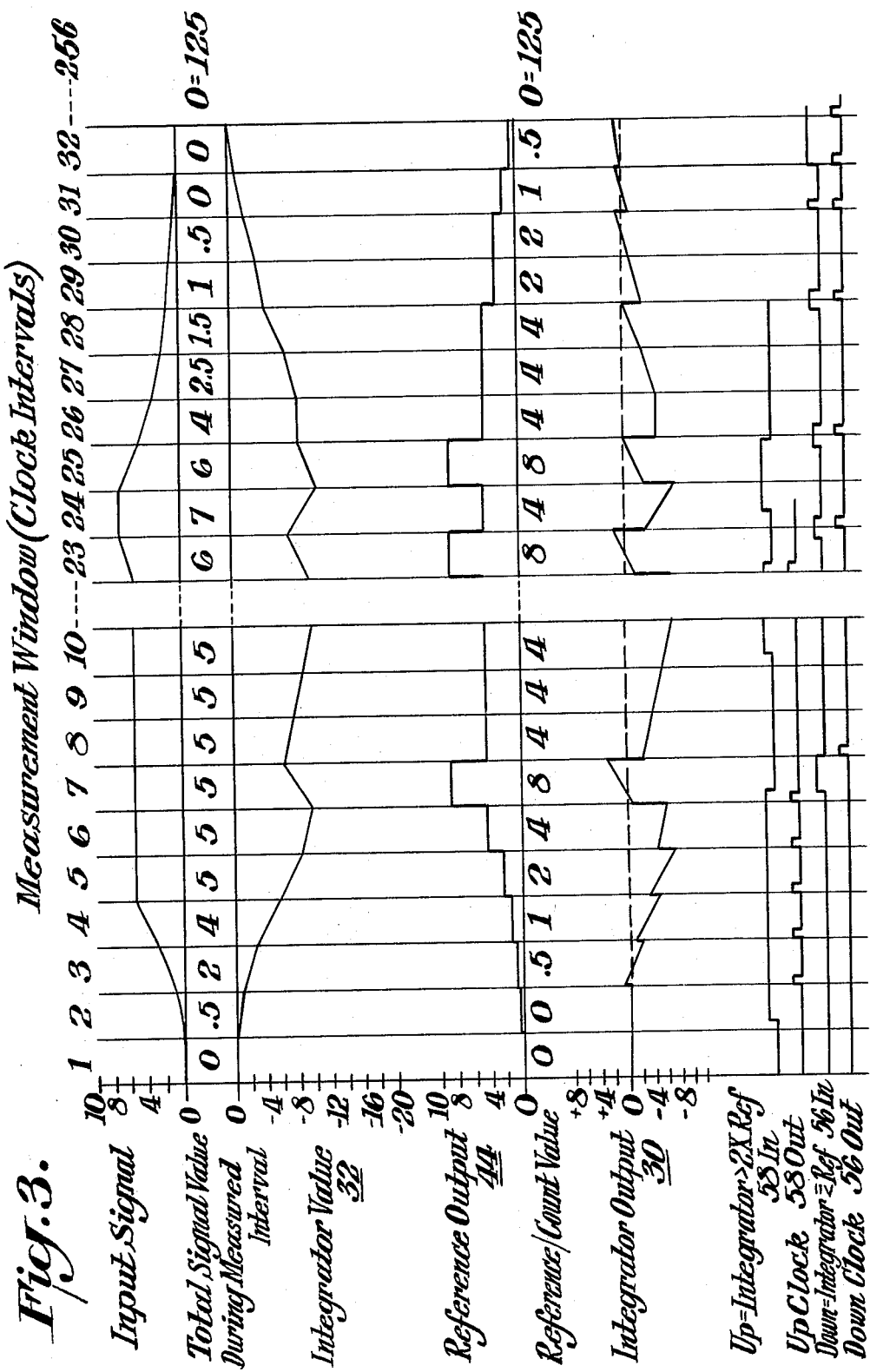

WIDE DYNAMIC RANGE ANALOG TO DIGITAL CONVERTER

TECHNICAL FIELD

This invention relates to analog to digital converters and, more particularly, to analog to digital converters having a relatively wide dynamic range.

BACKGROUND ART

Over the years various analog to digital converter systems have been devised. One of the wider used systems has been the so-called dual slope integration technique that is used somewhat extensively in digital voltmeters and similar systems. In this technique an integrator is allowed to integrate the analog signal in one sense for a period of time. Next a constant current is applied to the integrator to cause it to integrate back down to zero. The time required to return the integrator to zero is a measure of the amplitude of the analog signal, and the counter counting that time interval is a digital representation of the analog signal.

While quite satisfactory for signals of a relatively limited amplitude range, the usefulness of the so-called "dual slope" method greatly decreases in the presence of input signals varying in amplitude over a wide dynamic range. To accommodate such widely varying signals, various users have resorted to programmable gain amplifiers in combination with voltage to frequency converters to achieve the desired accuracy for such wide dynamic ranges. With these systems the output of the amplifier is applied to the voltage to frequency converter and the frequency output counted. The output of the counter is applied to a digital to analog converter, which output analog signal is subtracted from the input signal at the input to the programmable gain amplifier. Even systems of this type are somewhat limited in their ability to accommodate wide dynamic ranges.

Another approach taken to accommodate a wide dynamic range is the use of dual integrators and in these systems, two integrators are used, one or the other being switched OFF as it reaches a predetermined level, while the other is used to continue the integration. While these systems function adequately, they are somewhat expensive and require complex switching to achieve the desired dynamic range.

It is therefore an object of this invention to provide an improved method for converting analog signals having a wide dynamic range to digital form.

Another object of this invention is to provide an improved apparatus for converting analog signals having a wide dynamic range to digital form.

DISCLOSURE OF INVENTION

In accordance with one aspect of the method of this invention, an input analog signal is converted to an output digital signal by integrating the input signal in a first sense to provide an output signal, simultaneously integrating a reference signal in a second sense opposite to the first sense to reduce the amplitude of the output signal, periodically generating a digital signal whose value varies directly in accordance with the difference in the relative amplitudes of the integrated and reference signals, converting said periodic digital signals to analog form to provide the reference signal, and summing said periodic digital signals over a predetermined measuring interval to provide said output digital signal.

In a particular method, the amplitudes of the integrated signal and the reference signal are compared and a digital signal is periodically generated that represents a quantity of increased or decreased magnitude in accordance with such comparison. Each time the digital signal is generated a counter and associated digital to analog converter are indexed geometrically up or down in accordance with the comparison. In this manner the amount of energy stored in the integrator at any given time is a relatively small quantity. Since the reference signal is increased or decreased in amplitude as necessary in a geometric manner so as to decrease the stored charge in the integrator to a finite small amount, this prevents the integrator from becoming overloaded and permits it to handle relatively wide dynamic ranges of input signals.

An analog to digital converter using this method of converting an input analog signal to an output signal includes an integrator having opposite polarity inputs and an output, a source of a reference signal coupled to one of the integrator inputs, means for coupling the input analog signal to the other of said integrator inputs, a comparator for comparing amplitude the output of said integrator with said reference signal, a first counter coupled to the comparator for periodically incrementing up in count when said integrator output exceeds said reference signal and down in count when said integrator output is less than said reference signal, a digital to analog converter coupled to the output of said first counter for providing said reference signal source, and a second counter for summing the periodic outputs of said first counter over a predetermined measuring interval to provide said output digital signal.

In one aspect of the apparatus the converter includes a range decoder coupled to the output of the first counter for providing a reference signal that varies geometrically in accordance with the output of the first counter. In this manner the reference signal amplitude may be varied geometrically such that it may quickly follow the input analog signal.

Further advantages and features of this invention will become apparent upon consideration of the following description wherein:

FIG. 3 is a series of timing waveforms depicting the operation of the embodiment illustrated in FIG. 2 in response to a typical input waveform.

BEST MODE FOR CARRYING OUT THE INVENTION

Figure 1:
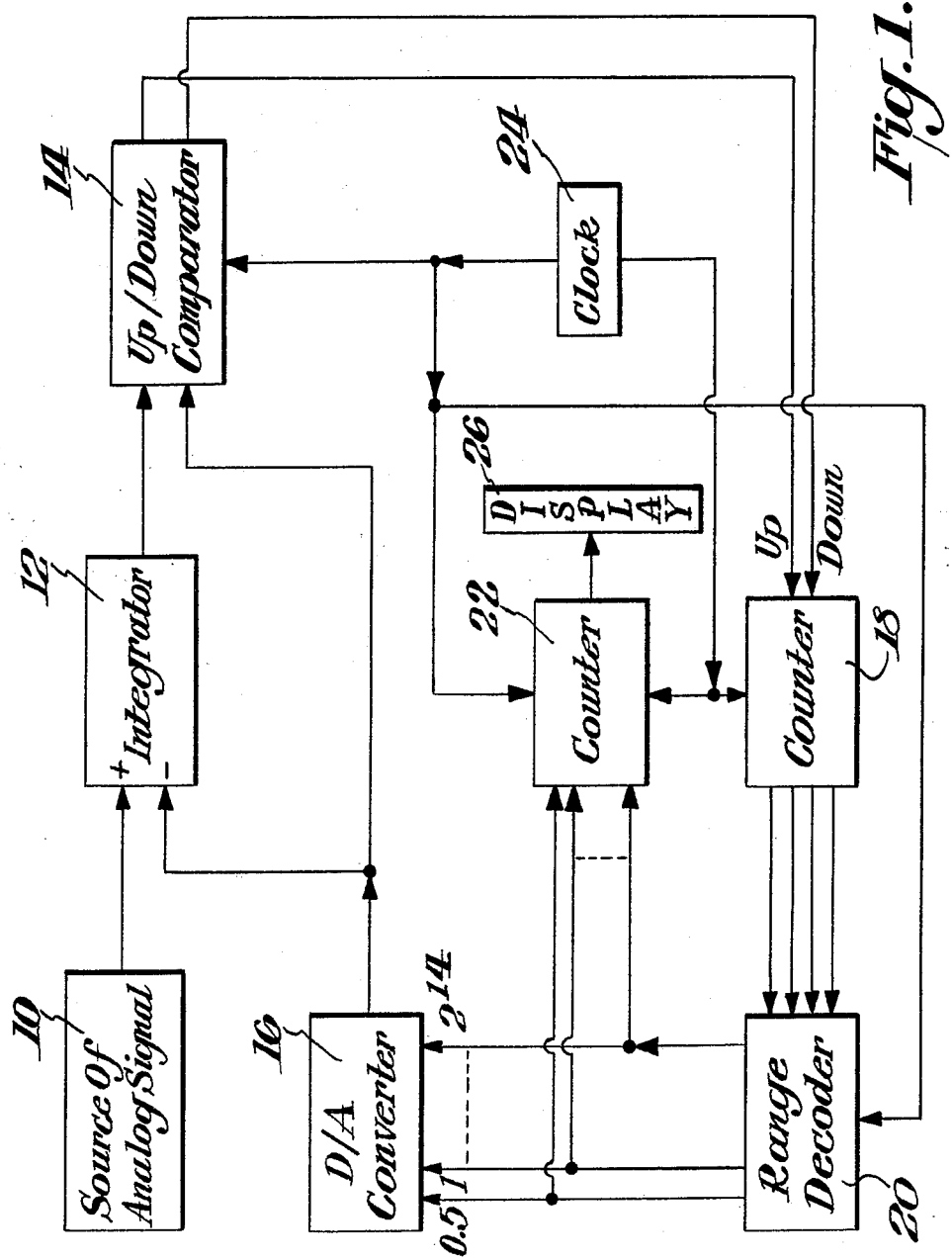
FIG. 1 is a generalized block diagram of an analog wide dynamic range analog to digital converter constructed in accordance with the invention.

As may be seen in FIG. 1, an analog signal from a source 10 is applied to the positive input of a differential integrator 12. This source of analog signal may be virtually any desired source. In a particular application this source may be the output of an electron multiplier say from a mass spectrometer. In this instance the input signal is generated by ions striking an electron multiplier with a charge gain of typically $1 \times 10^5$. The typical input range is from $1.6 \times 10^{-14}$ coulombs as a minimum to $1 \times 10^{-5}$ coulombs as a maximum in any one second interval. Hence the signal may vary over a dynamic range of $6.25 \times 10^8$ when sampled at one second intervals. For intervals of less time, the dynamic range of the signal will be less, and it will be proportional to the sampling time.

Few known converter circuits are capable of operating with this wide dynamic range. The circuit described herein achieves this range by using a unique method and apparatus. According to this unique apparatus, the output of the integrator 12 is coupled to one input of a comparator 14 for determining whether or not the integrated signal is greater than or less than a reference signal, derived from a digital to analog converter 16. The reference signal from the digital to analog converter 16 (D-A) is also applied to the negative input of the integrator 12.

The output of the comparator 14, indicating that the integrated signal is greater than the reference signal (indicating that the output of D-A converter 16 need be increased) is coupled to the input of counter 18 which causes the counter to count up. Conversely if the integrated signal is less than the reference signal, the comparator 14 is connected to the down count input of the counter 18. The output of the counter 18, in the form of a 4 bit binary signal, is coupled to a range decoder 20 that decodes the 4 bit binary signal into one of 16 levels.

In the application for mass spectrometry, these signal levels will vary geometrically from 0.5 to 1, 2, 4 and on up in binary increments to $2^{10}$. These range levels will denote different levels of ion current and, as noted, vary geometrically over a relatively wide dynamic range. These levels cause the D-A converter to generate varying levels of dc signals which are subtracted in the integrator 12 so as to maintain stored charge in the integrator at a nominal level virtually at all times. These same levels from the range decoder 20 are coupled to a second counter 22 which during each time period, controlled by a clock pulse source 24, are counted as an indication of the total charge removed from the integrator. The total charge removed is an indication of the amplitude of the analog signal. The comparator 14 is also triggered periodically by the clock pulse source 24 to effect the comparisons and provide an up or down count input to the counter 18. The output of the counter 20 is coupled to a display device which may be any of those conventionally available on the market today or it may be a computer for storage and readout.

The counter 22 is periodically reset to zero by a reset pulse derived from a clock pulse source 24 after a predetermined number of time periods have occurred. This pre-selected time period is the counting interval which in a typical application may be 100 microseconds. In the mass spectrometer application, 256 samples of the input analog signal is taken, one each 390.625 nanoseconds making the total measuring interval 100 microseconds. Hence an output converted analog to digital signal is available every 100 microseconds.

The apparatus depicted in FIG. 1 is capable of performing the method of this invention. According to this method, the analog signal from the source 10 is applied to an integrator where an electrical charge is stored in accordance with the amplitude and sense of the analog signal. Simultaneously therewith, the charge built up in the integrator is removed at a geometrically varying rate sufficient to maintain stored charge at a nominal level. This is accomplished by periodically increasing the amount of charge withdrawn from the integrator until such time that the output of the integrator in effect reverses sign indicating that charge is being withdrawn too rapidly, i.e., the reference level exceeds the amplitude of the input signal when this occurs and the value of the reference signal is decreased. The reference signal is increased or decreased according to need at a geometric rate as noted. The amount of charge withdrawn during each time interval is counted on a counter whose count is representative of the value of the analog signal. This count is continued over the desired measuring interval at which time the count is indicative of the digital value of the analog input signal. Because the reference signal is varied in amplitude geometrically, the method is capable of converting an analog signal that varies over a wide dynamic range into digital form. A converter using this method is capable of using relatively low cost integrators since it never becomes overloaded within its designed wide dynamic range.

Figure 2A:
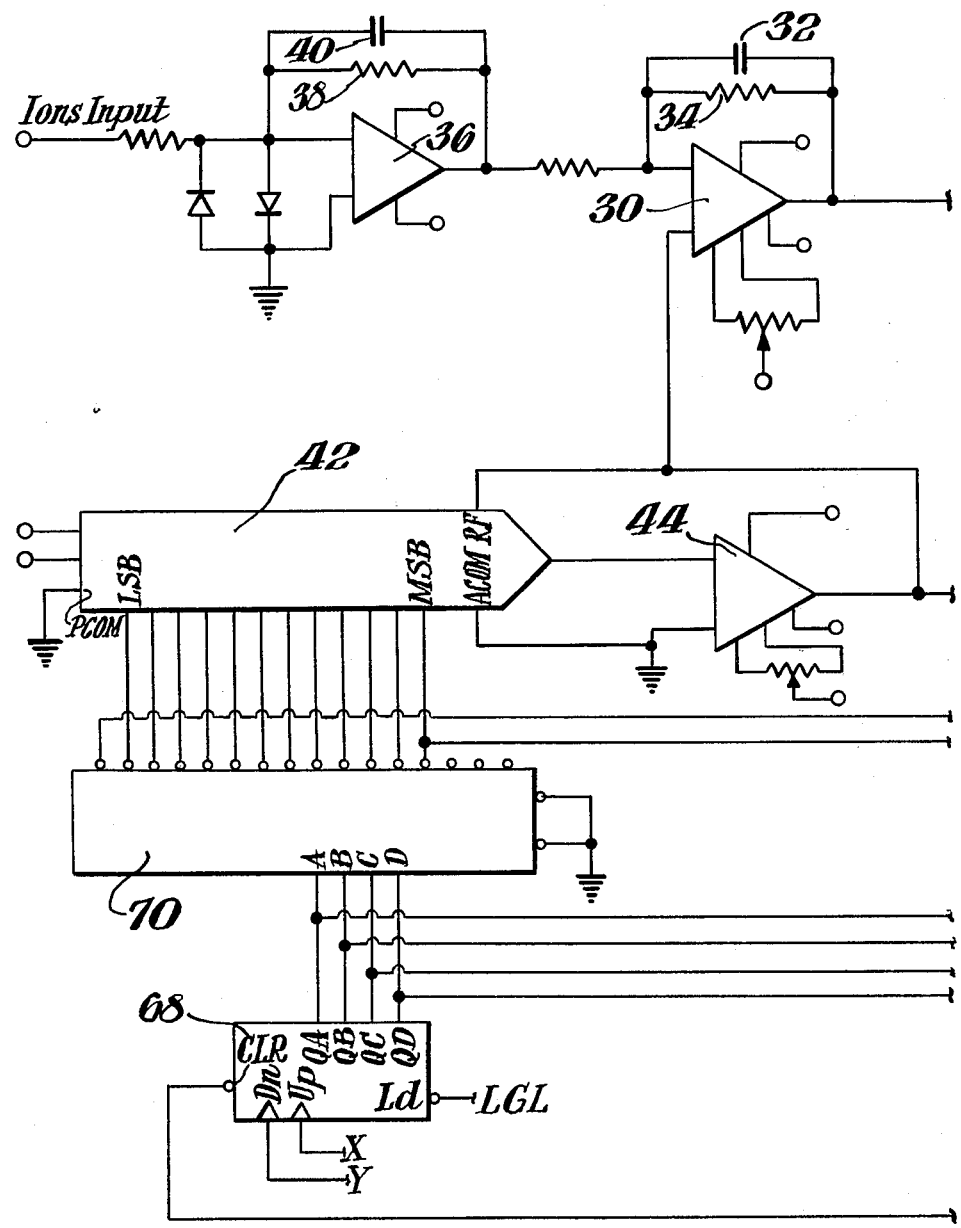
FIGS. 2A and 2B are block schematic diagrams of a preferred embodiment of the analog to digital converter depicted in FIG. 1.
Figure 2B:
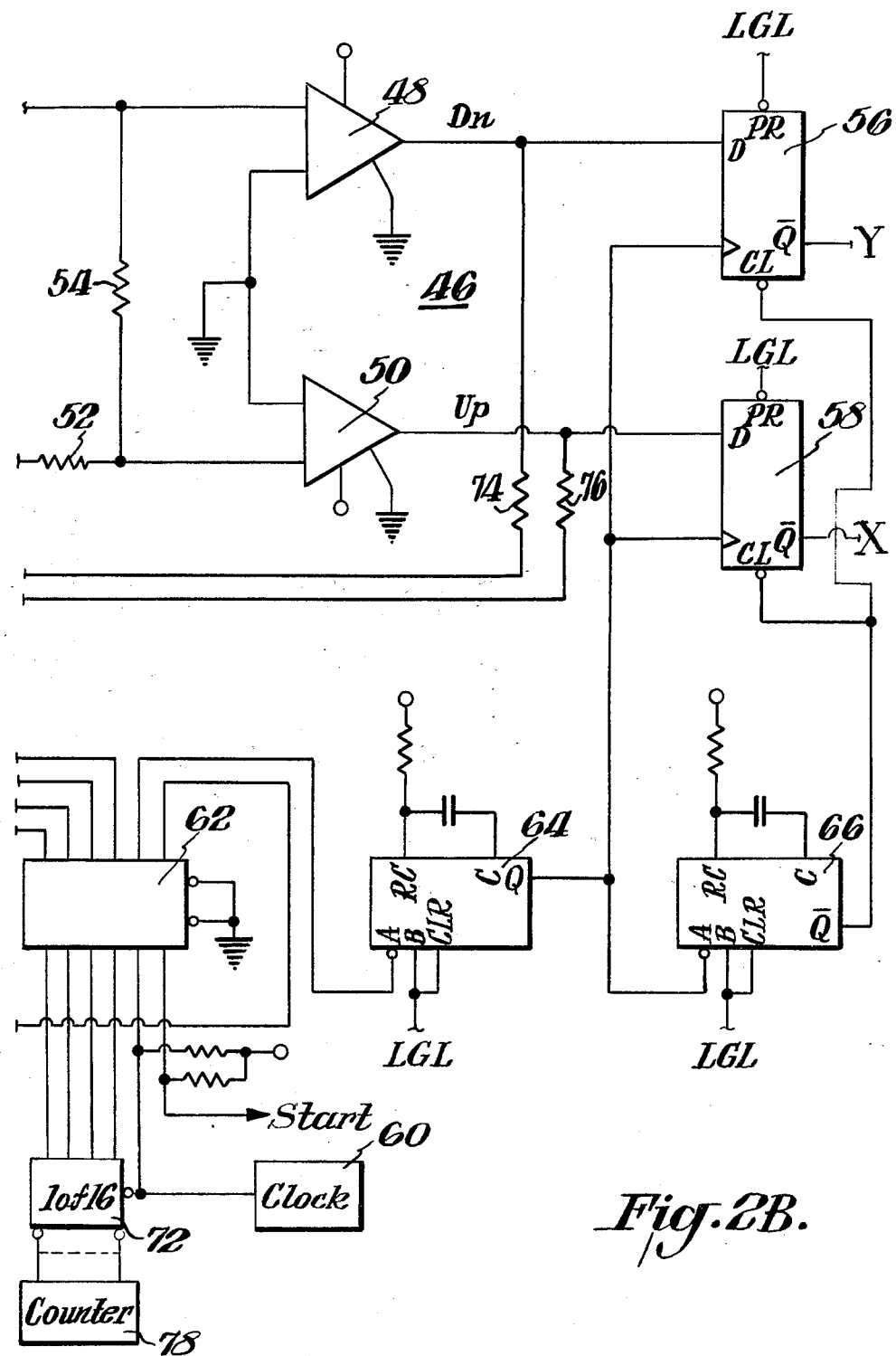

A preferred form of the apparatus for effecting this method is depicted in FIGS. 2A and 2B. This preferred converter includes an integrator 30, which stores, during a predetermined measuring cycle, an electrical charge derived from an analog signal source which in a preferred embodiment is the electron multiplier from a mass spectrometer for measuring ions. The integrator 30 consists of a low drift, high speed operational amplifier connected as an integrator with a low frequency reset. Preferably the signal from the electron multiplier is coupled through an operational amplifier 36, which is used as a current to voltage converter, to the negative input of the integrator. As is the convention, the gain of the current to voltage converter is determined by a gain resistor 38 and the band width of the amplifier is determined by a capacitor 40. The band width of the amplifier is such that an incoming signal response is decreased to a frequency at which the integrator 30 can respond to the incoming signal. A reset or reference input signal, derived from a signal supplied by a digital to analog converter 42, is coupled to the positive input of the integrator. This is a high speed D-A converter with a current output, the current output is converted to a voltage output through an operational amplifier 44.

The integrator output, or the output from the integrator 30 which represents a charge stored in an amount proportional to the input signal less that removed by the D-A converter 42, is coupled to an analog comparator 46. This comparator 46 includes two analog comparators 48 and 50. The input of one comparator 48 is the output value of the integrator 30, which is compared to an analog ground. The input to the other comparator 50 is the sum of the output of the integrator 30 and the reference signal developed at the output of the operational amplifier 44. This sum is developed through two equal resistors 52 and 54, which are coupled in series between the output of the amplifier 42 and output of the integrator 30. This sum is applied to the negative input of the other comparator 50, whose positive input is again analog ground.

The net result of the comparison is that the one comparator 48 generates a positive signal when the value of the stored charge in the integrator exceeds the value of the reference signal. This signal is used to down range the reference D-A converter. The output of the other comparator 50 goes positive when the value stored in the integrator 30 exceeds twice the value of the reference voltage developed by operational amplifier 44. This signal is used to up range the reference D-A converter. The output of the respective comparators 48-50 is coupled to the respective input of corresponding latches 56 and 58 respectively. These latches are edge triggered, direct set (D type) latches. That is, their outputs store the digital value at their input at the time of the positive transition of the clock pulse.

Timing for the circuits is provided from a clock pulse source 60. This clock pulse source 60 may be of any frequency. As mentioned, a preferred embodiment of the invention is for the application of the measuring ions derived from the electron multiplier of a mass spectrometer. In this case the clock is 2.56 MHz. The clock signal is transmitted to the ion count converter circuitry through a shaper 62 which is used to receive the clock pulse and shape it for use inside the converter. The clock pulse is further processed by monostable multivibrators 64 and 66. These monostable multivibrators are used to generate two very narrow pulses, one following the other, upon receipt of the leading edge of the clock pulse. The earlier pulse from the first one shot multivibrator 64 is coupled to the clock inputs of the respective latches 56 and 58. The complementary output of the latch 56 is coupled to the down incrementing input of a counter 68, correspondingly the complimentary output of the up latch 58 is coupled the up incrementing input of the counter 68. The counter 68 is a four bit up/down binary counter.

At the beginning of a sequence, a start signal, which may be derived from a simple switch (herein designated start), is coupled through the shaper to the clear input of the counter 68. This causes the up/down counter 68 to go to a known state from which operation of the ion count converter can be commenced. The output of the up/down counter 68, which includes 4 binary weighted outputs $2^0$, $2^1$, $2^2$, and $2^3$, are coupled both to a 1 of 16 decoder 70 and through a driver receiver 62 to an external 1 of 16 decoder 72. The 1 of 16 decoder 70 selects an individual output corresponding to the binary weight of the input signal as received from the counter 68. These outputs from the decoder 70 provide weighted outputs to the corresponding inputs of the digital to analog converter 42. These several outputs are binary weighted each increasing by a factor of 2 over the lower weighted output, such that the respective inputs to the digital to analog converter each has a binary weight twice that of the lower input, i.e., the inputs vary geometrically. Further, the low output or zero output of 1 of 16 decoder 70 is applied through a resistor to the output of the comparator 48 combining with the output of comparator 48, which is an open collector, in such a way as to form an AND gate such that both the 1 of 16 decoder 70 zero signal must be "high" and the output of the comparator 48 must be "high" in order to provide a "high" signal input to device 56. The outputs, of course, of the decoder 70 are logically inverted such that they are "low" going when the output is true. The gating of the low order output of the 1 of 16 decoder 70 with the comparator 48 inhibits down ranging of the reference signal below zero. Similarly the high order output of the decoder 70 is coupled to the resistor 76 to the output of the up comparator 50. This provides a similar gating function to prevent the ranging of the D-A converter above this most significant digit bit.

The converted digital output signal is derived by coupling the output from the up/down count of the counter 68 through the shaper 62 to a second 1 of 16 decoder 72 which may be substantially identical in form to the decoder 70. The only difference is that one of the enable inputs of the decoder 72 is supplied a clock signal directly from the clock source 60. The operation of 1 of 16 decoder 72 is substantially the same as decoder 70 with the exception that the negative-going outputs are enabled only during a specific portion of the clock cycle. These clocked outputs are used to selectively increment a counter stage during each measuring period during the measuring cycle. Thus, the total incremented value of the counter 70 at the end of the measuring cycle represents the total charge or energy withdrawn from the storage capacitor which is directly proportional and related to the digital equivalent of the input signal during the measuring period. This counter 78 is a ranging type counter in which the inputs may be applied to various clock inputs to permit the counter to count at differing rates according to the weighted value of the charge being subtracted from the integrator.

For completeness of description a circuit of this type was constructed in which the device or amplifier 36 is a Burr Brown model 3522 FET input operational amplifier device. Integrator 30 is a National Semiconductor model LF156A input operational amplifier with an extremely high speed slewing rate and low drift characteristics. Comparator 46 consists of a National Semiconductor dual high speed comparator model LM319. This comparator has extremely low input offset voltage and open collector output. Latches 56 and 58 are comprised of a Texas Instrument 742574 dual D type integrated circuit. One shot or monostable multivibrators 64 and 66 are comprised of a TI 741S123 dual monostable multivibrator integrated circuit. Driver receiver device 62 consists of a TI 741S240 octal driver receiver integrated circuit. Six driver receiver sections are used. Up/down counter 68 consists of a TI up/down counter device type 741S193. 1 of 16 decoder device type 70 and 72 consists of a TI 74154 LSI integrated circuit. Digital analog converter device 42 consists of a Burr Brown model DAC 60-12 which is a high speed 12 bit digital to analog converter with current output. Amplifier 44 consists of Burr Brown model 3550S which is a bi-polar high slew rate operational amplifier. The clock source 60 may be any suitable clock source with output levels compatible with the TTL logic. The counter 78 consists of a series of JK type flip flops TI type 74LS107 with clock inputs to succeeding stages derived from the previous stage through an exclusive OR gate TI type 74L586.

In FIG. 3 there is shown a partial timing wave form depicting the periodic clock intervals for each incremental measurement. It is, of course, the total of these incremental values that provide the measurement or the conversion of the particular input signal during a measuring period or interval. A typical measuring interval is from 256 to several million of these clock periods depending upon the resolution required. The wave forms depicted are starting at the top, first a typical input signal, and second, in numerical form, the total signal value obtained during a measuring interval. Next is a wave form depicting the value of integrator 32. Next, is the output of the reference 44. Next is a line of numerals depicting the absolute value existing on the counter 68 during each clock interval. The next wave form is that of the integrator output 30. The four bottom wave forms indicate, respectively, the input of the uplatch 58, the output of the uplatch 58, the input of the downlatch 56 and the output of the downlatch 56.

In a typical measurement, the input signal, depicted by the uppermost wave form, begins at a zero value during the first clock interval, and gradually increases to a steady state value (which is broken) following which it rises slightly then decreases back to zero. In this illustrated case they complete the measuring interval after 31 clock periods with the occurence of this input signal. During the second measurement period or window, the actual value measured increases to a level of 0.5. At the end of this second period this level of 0.5 is sensed by the up comparator as being greater than the referenced value which was starting at 0. This comparison causes the reference to be incremented to a level of 0.5 so that this value may be subtracted during the third measurement window. During the third measurement window, the signal value has increased to a level of 2. This causes the integrator output to now be greater than two times the reference signal which was 0.5 causing the reference signal to be set to a level 1 at the beginning of time window 4. During time window 4, the signal value has risen to a level of 4. This causes the output of the integrator to increase to a point where it is greater than two times the reference signal, causing the upcount comparator to again uprange the reference signal to a value of 2 during measurement window 5.

At measurement window 5, the input signal has now leveled off at a continuous value of five, however, at the end of window 5 the output of the integrator is still greater than 2 times the reference value of 2, causing the comparator to uprange, again, to a reference value of 4 for measurement window 6. During measurement window 6 the output of the integrator continues to climb because of the steady state of 5 and a reference level of four causing the output of the integrator to exceed a value of 8 at the end of window 6. Because of this, the comparator further upranges the reference signal to a level of 8 for the period of window 7. This level of 8 causes the output of the integrator to swing positive during the middle of measurement window 7, removing a major charge from the comparator, and sets its value at the end of measurement window 7 to a value of less than 8. This causes the downrange comparator to be activated, decrementing the reference value back to 4 for measurement window 8. During measurement window 8, five units of energy are coming in with four being taken out, thus the integrator stores the one extra unit of energy, which is received, causing its value to become slightly more negative than at the beginning.

The same is true during window 9 and window 10. At the end of window 10, however, the integrator value has again approached, or is equal to, a value of two times the reference, or 8, thus the up comparator causes the reference value to increment to a level of 8. Under this condition, if the signal remains steady state for the next several measuring periods 11 through 22, the integrator will, as occurred during the measuring periods 7 through 10, cycle first at one level, then at the other lower level to follow this steady state condition. At the beginning of the time interval 23, assume that the signal level increases to a level of 6 at which time, because of the previous condition existing in 22 which is similar to window 11 with the exception that the signal level is increased the uprange comparator causes the value of the reference to go to 8 because 8 units of energy has been taken out with only 6 received. The reference decrements to a level of 4 during window 24. However, during window 24 seven units of energy have been received causing the integrator value to again exceed a value of 8 so that at window 25 the uprange comparator increments the reference value back to 8 for a measurement window 25. During this measurement window, however, only 6 units are received with 8 units taken out causing the integrator value to go less than 8 at the end of measurement window 25 causing the down range comparator to decrement the reference value to a level of 4 for window 26. During window 26 this four was equal to the input signal received causing no action to be taken at the end of measurement window 26 and leaving the reference value at 4 for measurement window 27. During window 27 the input signal drops to a value of 2.5 causing a net decrease in the integrator value of 1.5. This, however, still leaves more than 4 signal units in the integrator causing no change in reference level at the end of measurement window 27. During window 28, the input signal drops further to a value of 1.5 units with the reference value being at 4. This causes the value of the signal stored in the integrator to drop below 4 at the end of measurement window 28, causing the downrange comparator to decrement the reference value to 2 for window 29. During window 29, the signal received is 1, this signal received and the reference of 2 does not sufficiently remove the signal in the integrator to cause it to downrange at this time so no action is taken at the end of window 29. During window 30 the signal received is dropped to a value of 0.5 units while the reference is still at 2. This causes the output of the integrator to go below 2 units stored at the end of 30, causing the downrange comparator to decrement the reference to the next lower range of 1 for window 31. At window 31, however, no signal is received. This causes the output of the integrator to drop below 1 during window 31 such that at the end of window 31 there is less signal stored in the integrator than the reference signal causing the downrange comparator to further decrement the reference signal to 0.5 for window 32. Likewise, at window 32, there is no signal received and the integrator is completely cleared of the 0.5 reference signal such that at the end of window 32 the reference signal is now higher than the integrator signal and the reference signal is then turned off. Hence, at the end of a measuring period, the counts appearing in the counter 78 is 125 representing the digital value of the total input signal received during the measuring interval.

The converter described is hence seen to be one that is capable of high speed operation over an extremely wide dynamic range so as to accommodate the measurement if desired of individual ion counts up to many, many ion counts.

I claim:

1. A method of geometrically converting an input analog signal to an output signal comprising the steps of:

integrating said input signal in a first sense to provide an integrating signal,
  simultaneously therewith integrating a reference signal in a second sense opposite said first sense to reduce the amplitude of said integrated signal,
  periodically comparing the amplitudes of said integrated and reference signals,
  geometrically adjusting a digital signal according to each comparison,
  converting each said adjusted digital signal to analog form to provide said reference signal, and
  totalizing, over a predetermined measuring interval, the values of each said adjusted digital signal at the time of each comparison, thus to provide said output digital signal.

2. The method of claim 1 wherein said adjusting step increments or decrements a counter in accordance with said difference to provide (a) a geometric procession or recession, respectively, in a D/A converter for the generation of said reference signal and (b) a higher or lower order input to a counter for totalizing to provide said output digital signal.

3. An analog to digital converter for converting an input analog signal to an output digital signal comprising:

an integrator having opposite polarity inputs and an output, a source of a reference signal coupled to one of said integrator inputs, means for coupling said input analog signal to the other of said integrator inputs, a comparator for periodically comparing in amplitude said integrator output with said reference signal, a first counter coupled to said comparator for periodically incrementing in count when said comparison determines that the integrator output exceeds said reference signal and decrementing in count when said comparison determines that the integrator output is less than said reference signal, said reference signal source comprising a digital to analog converter coupled to the output of said counter for geometrically varying the amplitude of said reference signal in accordance with the count in said first counter, and a second counter for counting over a predetermined measuring interval at a geometric rate that varies in accordance with the count in said first counter to provide said output digital signal.

4. The analog to digital converter of claim 3 wherein said converter includes a range decoder coupled to the output of said first counter for providing a reference signal that varies geometrically in accordance with the output of said first counter.

5. The analog to digital converter of claim 4 wherein said second counter is coupled to the output of said range decoder.

6. The analog to digital converter of claim 5 wherein said comparator and said second counter are periodically enabled.

7. The analog to digital converter of claim 6 wherein said comparator and said second counter are enabled a predetermined number of times to provide a measuring interval.

8. The analog to digital converter of claim 4 which includes a second range decoder coupled to the output of said first counter, said second counter having an input coupled to the output of said range decoder.

* * * * *